United States Patent [19]
Ross

[11] Patent Number: 4,864,254
[45] Date of Patent: Sep. 5, 1989

[54] HIGH FREQUENCY PHASE DETECTOR USING FET BRIDGE

[75] Inventor: Michael Ross, Montreal, Canada

[73] Assignee: Northern Telecom Limited, Montreal, Canada

[21] Appl. No.: 279,167

[22] Filed: Dec. 2, 1988

[51] Int. Cl.⁴ .............................................. H03L 7/00
[52] U.S. Cl. ...................................... 331/8; 307/511; 307/514; 328/155
[58] Field of Search ...................... 331/8, 25; 328/133, 328/134, 155; 307/511, 525, 526, 527, 514

[56] References Cited

U.S. PATENT DOCUMENTS 3,591,854 7/1971 Cole ...................................... 307/526
4,659,949 4/1987 Okanobu ............................ 331/8 X Primary Examiner—Eugene R. LaRoche
Assistant Examiner—Robert J. Pascal
Attorney, Agent, or Firm—R. John Haley

[57] ABSTRACT

A phase detector includes a bridge of FETs which are simultaneously rendered conductive by pulses of a reference signal having a very small duty cycle. A higher frequency signal, whose phase in relation to the reference signal is to be detected, is supplied to a gate of one of the FETs. A bridge output signal is low pass filtered and differentially amplified to produce a phase detector output signal. The phase detector output signal can be used directly to control the frequency of a voltage controlled oscillator which produces the higher frequency signal.

7 Claims, 1 Drawing Sheet

HIGH FREQUENCY PHASE DETECTOR USING FET BRIDGE

This invention relates to phase detectors and to apparatus including a phase detector.

BACKGROUND OF THE INVENTION

It is frequently desired to produce a first signal at a predetermined frequency, phase synchronized to a second, reference signal which may have a much lower frequency. A PLL (phase locked loop) may typically be used for this purpose, the PLL including a VCO (voltage controlled oscillator), a frequency divider, and a phase detector or comparator. An output signal of the VCO, constituting the first signal, is frequency divided by the frequency divider to the frequency of the reference signal, and the resulting signal is compared in phase with the reference signal by the phase detector to produce a control signal for controlling the VCO.

Whilst such a PLL is effective for relatively low-frequency signals, it necessitates the provision of a frequency divider. For high-frequency signals, for example where the first signal has a frequency greater than 1 GHz for use for example in microwave radio transmission systems, conventional forms of the PLL are inconvenient, making it necessary to provide relatively complicated circuitry for performing phase detection at lower frequencies (e.g. at the transmission system intermediate frequency).

An object of this invention, therefore, is to provide an improved phase detector and apparatus including such a phase detector.

SUMMARY OF THE INVENTION

According to this invention there is provided a phase detector comprising: four electronic switching devices each having a controlled path and at least one control terminal, the four devices having their controlled paths connected in respective arms of a bridge having a first diagonal for connection between points of reference potential and having a second diagonal for providing a bridge output signal; means for supplying a reference signal to a control terminal of each of said devices for simultaneously controlling the controlled paths of said devices to become conductive and non-conductive; means for supplying a further signal, whose phase is to be detected, to a control terminal of one of said devices; and low pass filtering means connected to the second diagonal of the bridge for low pass filtering the bridge output signal to produce a signal representing a phase of the further signal relative to a phase of the reference signal.

Each electronic switching device can comprise any suitable form of device for switching at the reference signal frequency; it may for example be in the form of a transmission gate or bipolar transistor, but it preferably comprises a field effect transistor.

The low pass filtering means preferably includes a capacitor connected across the second diagonal of the bridge, the capacitor serving to integrate the bridge output signal.

The phase detector preferably includes differential amplifier means connected to an output of the low pass filtering means for producing a phase detection output signal of the phase detector. The phase detection output signal is consequently a relatively slowly varying, or d.c., voltage which can be used directly for control purposes, for example for controlling a VCO.

The invention thus also provides apparatus comprising a phase detector as recited above; a voltage controlled oscillator (VCO) having a control input responsive to the phase detection output signal of the phase detector and having an output for a VCO output signal having a frequency within a predetermined tuning frequency range; and means coupling the VCO output signal to the phase detector as said further signal.

Such apparatus can include means for providing said reference signal to the phase detector, the reference signal being a pulsed signal having a predetermined frequency much less than the frequency of the VCO output signal and not less than said predetermined tuning frequency range, and having a pulse period, during which the controlled paths of the switching devices are controlled to become conductive, which is much less than a period of the pulsed signal. In other words, the pulsed reference signal has a very small duty cycle.

Desirably the pulse period, or conductive period of the electronic switching devices or FETs of the bridge, is much less than the period of the VCO output signal, which is thereby sampled at a relatively precise instant during its cycle. However, this need not be the case, and the phase detection operation may still be effective with longer reference signal pulse periods, lasting for a significant part of a cycle, or for a non-integral number of cycles, of the VCO output signal.

The apparatus is of particular advantage for high frequency signals, for example where the VCO output signal has a frequency greater than 1 GHz, and is particularly applicable to local oscillator arrangements in microwave radio transmission systems where the VCO output signal may have a frequency of the order of 5 to 18 GHz.

BRIEF DESCRIPTION OF THE DRAWINGS

The invention will be further understood from the following description with reference to the accompanying drawings, in which.

DESCRIPTION OF THE PREFERRED EMBODIMENT

Figure 1:
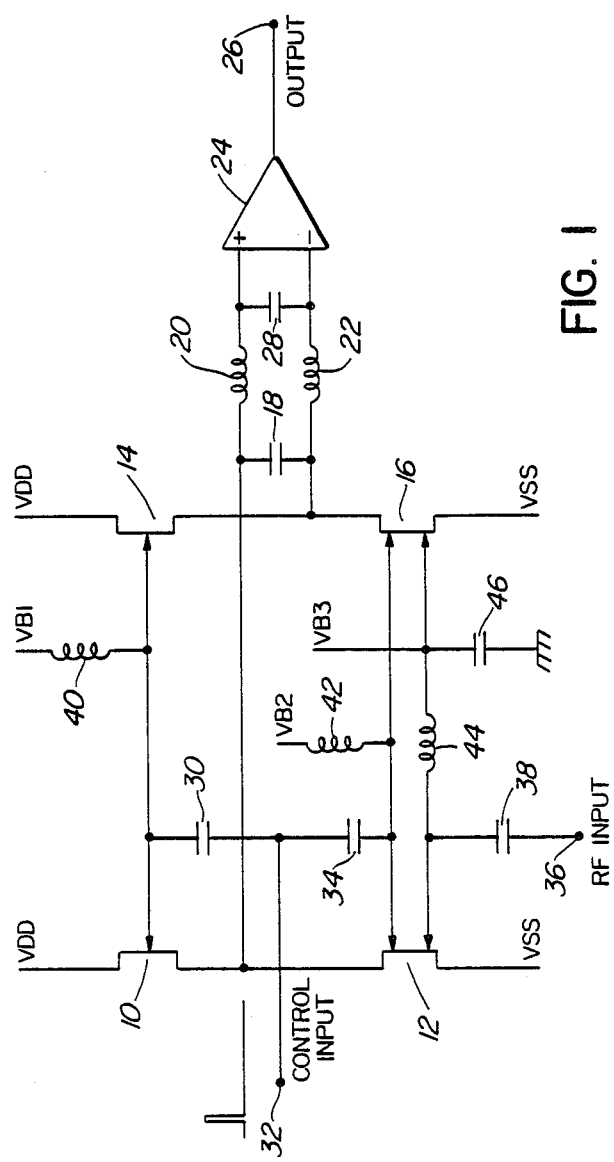
FIG. 1 schematically illustrates a phase detector in accordance with the invention.

Referring to FIG. 1, there is illustrated therein a balanced sampling phase detector including four FETs (field effect transistors) 10, 12, 14, and 16 arranged in respective arms of a bridge, with one diagonal of the bridge connected to drain and source voltage supplies VDD and VSS respectively. The FETs act as electronic switches operating in the manner described below, and may be of any suitable type, such as MESFETs, HEMTs, MOSFETs, or JFETs. For the high frequencies discussed below, the FETs may for example be of GaAs (gallium arsenide) form, and the voltage supplies VDD and VSS may be about +2 volts and −2 volts respectively.

A capacitor 18 is connected across the other diagonal, constituting an output, of the bridge, i.e. between a junction between the series-connected FETs 10 and 12 on the left-hand side of the bridge as illustrated, and a junction between the series-connected FETs 14 and 16 on the right-hand side of the bridge. The former junction is also connected via an inductor 20 to the non-inverting (+) input, and the latter junction is also connected via an inductor 22 to the inverting (−) input, of a differential amplifier 24 whose output constitutes an output of the phase detector at an output terminal 26. A capacitor 28 is connected between the inputs of the amplifier 24, and forms with the inductors 20 and 22 a low pass filter for the output of the bridge, integrated by the capacitor 18.

The FETs 10 and 14 have gates which are interconnected and coupled via a d.c. blocking capacitor 30 to a control input terminal 32 of the phase detector. The FETs 12 and 16 have first and second gates; the first gates are similarly interconnected and coupled via a d.c. blocking capacitor 34 to the terminal 32. In operation as described further below, narrow pulses at a predetermined frequency are supplied to the terminal as a sampling control signal. The FETs 10, 12, 14, and 16 are turned on by each short duration positive pulse and are turned off between such pulses, whereby the capacitor 18 connected across the output of the bridge serves for sampling at the pulse frequency an RF input signal which is supplied in operation to an RF input terminal 36 and is coupled via a d.c. blocking capacitor 38 to the second gate of the FET 12.

Figure 2:
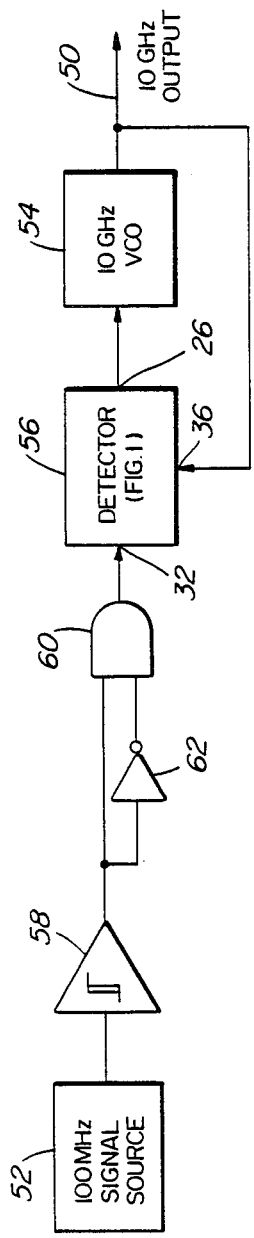
FIG. 2 is a block diagram illustrating a voltage-controlled oscillator (VCO) arrangement using the phase detector of FIG. 1.

For optimizing performance of the phase detector, one or more bias voltages VB1, VB2, and VB3 can be supplied, preferably via high frequency filtering inductors 40 and 42 as illustrated for the voltages VB1 and VB2 respectively, to the gates of the FETs. Thus as shown in FIG. 2 the bias voltage VB1 is supplied via the inductor 40 to the interconnected gates of the FETs 10 and 14, and the bias voltage VB2 is supplied via the inductor 42 to the interconnected first gates of the FETs 12 and 16. The bias voltage VB3 is supplied (directly as shown, but optionally via an inductor) to the second gates of the FETs 12 and 16, these gates being interconnected for d.c. purposes via an inductor 44. A capacitor 46 is connected between the second gate of the FET 16 and ground, and forms with the inductor 44 a low-pass filter which prevents the RF input signal being supplied to the second gate of the FET 16.

In operation, assuming that the duration of each pulse at the terminal 32 is a fraction of the period of the RF input signal at the terminal 36, then with each pulse the capacitor 18 will be charged or discharged according to the voltage of the RF input signal at the sampling time, and this charge state will be held between pulses. If the RF input signal is synchronized to a harmonic of the pulse frequency, then the charge of the capacitor 18 will reach an equilibrium state in which the voltage across the capacitor 18, and hence at the output terminal 24, represents the phase difference between these signals. For slightly desynchronized signals, the output voltage at the terminal 24 represents a beat or difference frequency between the RF input signal and the closest harmonic of the pulse frequency.

FIG. 2 illustrates an application of the phase detector of FIG. 1 in a voltage controlled oscillator (VCO) arrangement for providing an RF output signal on a line 50 at a precise frequency of for example 10 GHz, synchronized to a lower frequency signal of for example 100 MHz derived from a signal source 52. The RF output signal may be used for example as a local oscillator signal in a microwave radio transmission system.

A 10 GHz VCO 54 has an output connected to the output line 50, and a voltage control input connected to the output terminal 26 of a pulse detector 56 which is as described above with reference to FIG. 1. The VCO desirably has a tuning frequency range which is no more than the frequency of the source 52. For example, for the 100 MHz source 52 the VCO 54 may have a tuning range of 9.95 to 10.05 GHz.

The arrangement of FIG. 2 also includes a Schmitt trigger circuit 58 which is responsive to an output of the 100 MHz signal source 52 to produce a pulsed signal at this frequency, and a pulse edge detecting circuit comprising an AND gate 60 and an inverter 62. The inverter 62 is connected between the output of the trigger circuit 58 and one input of the gate 60, and the other input of the gate 60 is connected to the output of the trigger circuit 58, whereby at the output of the AND gate 60 there are produced very narrow pulses at the 100 MHz frequency of the source 52, the duration of each pulse corresponding to the propagation delay through the inverter 62. Such narrow pulses, constituting sampling pulses for the phase detector, are supplied to the control input terminal 32 of the phase detector 56. The RF output signal on the line 50 is also coupled back to the RF input terminal 36 of the phase detector 56.

In operation, the phase detector 56 produces at its output terminal 26 as described above a voltage which is used to control the frequency of the VCO 54. Within the tuning range of the VCO 54 as described above there is only one frequency, namely 10 GHz, which is a harmonic of the 100 MHz frequency of the source 52, whereby the VCO is tuned to precisely this frequency and is maintained in synchronism with it. The arrangement thus provides a precise synchronized RF output signal.

Numerous modifications, variations, and adaptations may be made to the particular embodiment of the invention as described above, in particular relating to the frequencies of the signals referred to, without departing from the scope of the invention as defined in the claims.

What is claimed is:

1. A phase detector comprising:
   four electronic switching devices each having a controlled path and at least one control terminal, the four devices having their controlled paths connected in respective arms of a bridge having a first diagonal for connection between points of reference potential and having a second diagonal for providing a bridge output signal;
   means for supplying a reference signal to a control terminal of each of said devices for simultaneously controlling the controlled paths of said devices to become alternately all conductive and all non-conductive;
   means for supplying a further signal, whose phase is to be detected, to a control terminal of only one of said devices; and
   low pass filtering means connected to the second diagonal of the bridge for low pass filtering the bridge output signal to produce a signal representing a phase of the further signal relative to a phase of the reference signal.

2. A phase detector as claimed in claim 1 wherein each of said devices comprises a field effect transistor.

3. A phase detector as claimed in claim 1 wherein the low pass filtering means includes a capacitor connected across the second diagonal of the bridge.

4. A phase detector as claimed in claim 1 and including differential amplifier means connected to an output of the low pass filtering means for producing a phase detection output signal of the phase detector.

5. Apparatus comprising:
a phase detector as claimed in claim 4;
a voltage controlled oscillator (VCO) having a control input responsive to the phase detection output signal of the phase detector and having an output for a VCO output signal having a frequency within a predetermined tuning frequency range; and
means coupling the VCO output signal to the phase detector as said further signal.

6. Apparatus comprising:
a phase detector, the phase detector comprising:
four electronic switching devices each having a controlled path and at least one control terminal, the four devices having their controlled paths connected in respective arms of a bridge having a first diagonal for connection between points of reference potential and having a second diagonal for providing a bridge output signal;
means for supplying a reference signal to a control terminal of each of said devices for simultaneously controlling the controlled paths of said devices to become alternately all conductive and all non-conductive;
means for supplying a further signal, whose phase is to be detected, to a control terminal of one of said devices;
low pass filtering means connected to the second diagonal of the bridge for low pass filtering the bridge output signal to produce a signal representing a phase of the further signal relative to a phase of the reference signal; and
differential amplifier means connected to an output of the low pass filtering means for producing a phase detection output signal of the phase detector;
a voltage controlled oscillator (VCO) having a central input responsive to the phase detection output signal of the phase detector and having an output for a VCO output signal having a frequency within a predetermined tuning frequency range;
means coupling the VCO output signal to the phase detector as said further signal; and
means for providing said reference signal to the phase detector, the reference signal being a pulsed signal having a predetermined frequency much less than a frequency of the VCO output signal and not less than said predetermined tuning frequency range, and having a pulse period, during which the controlled paths of the switching devices are controlled to become conductive, which is much less than a period of the pulsed signal.

7. Apparatus as claimed in claim 6 wherein the VCO output signal has frequency greater than 1 GHz.

* * * * *